United States Patent
Heike et al.

(10) Patent No.: US 6,670,622 B2
(45) Date of Patent: Dec. 30, 2003

(54) ELECTRON EXPOSURE DEVICE AND METHOD AND ELECTRONIC CHARACTERISTICS EVALUATION DEVICE USING SCANNING PROBE

(75) Inventors: Seiji Heike, Hatoyama (JP); Masayoshi Ishibashi, Hatoyama (JP); Tomihiro Hashizume, Hatoyama (JP)

(73) Assignee: Hitachi, Ltd., Tokyo (JP)

(*) Notice: Subject to any disclaimer, the term of this patent is extended or adjusted under 35 U.S.C. 154(b) by 136 days.

(21) Appl. No.: 10/082,341

(22) Filed: Feb. 26, 2002

(65) Prior Publication Data
US 2003/0107007 A1 Jun. 12, 2003

(30) Foreign Application Priority Data
Dec. 10, 2001 (JP) ......................... 2001-376059

(51) Int. Cl.[7] .............. A61N 5/00; G21G 5/00; G21K 5/10; H01J 37/08; H01L 21/31
(52) U.S. Cl. ................. 250/492.2; 250/492.1; 250/492.21; 250/492.22; 250/492.23; 438/759
(58) Field of Search ............... 250/492.1, 492.2, 250/492.21, 492.22, 492.23; 438/759

(56) References Cited

U.S. PATENT DOCUMENTS 6,000,947 A * 12/1999 Minne et al. ............... 438/759
6,147,355 A * 11/2000 Ando et al. ............... 250/492.2
6,262,426 B1 * 7/2001 Zafiratos ................ 250/492.2

FOREIGN PATENT DOCUMENTS

JP 11-073906 6/1998

OTHER PUBLICATIONS

Masayoshi Ishibashi, Seiji Heike, Hiroshi Kajiyama, Yasuo Wada and Tomihiro Hashizume, "Characteristics of scanning–probe lithography with a current–controlled exposure system", Applied Physics Letters (Mar. 31, 1998), vol. 72, No. 13, pp. 1581–1583.

* cited by examiner

Primary Examiner—John R. Lee
Assistant Examiner—Mary El-Shammaa

(57) ABSTRACT

Current passed through a resist layer or insulating layer is controlled by changing the amplitude of an AC voltage to provide an electron exposure device or electric characteristics evaluation device using a scanning probe.

12 Claims, 8 Drawing Sheets

ELECTRON EXPOSURE DEVICE AND METHOD AND ELECTRONIC CHARACTERISTICS EVALUATION DEVICE USING SCANNING PROBE

BACKGROUND OF THE INVENTION

1. Field of the Invention

The present invention relates to an electron exposure device used in fine patterning by a scanning probe microscope, and to a device using this structure to evaluate electric characteristics.

2. Description of the Related Art

As the integration density of semiconductor device components increases, fine patterning technology becomes increasingly necessary, but it is expected that technology using photolithography will be limited to minimum feature dimensions of the order of 100 nm, depending on the light wavelengths and lens materials employed. In recent years, as one potential alternative system, a lithography device using a scanning probe microscope, which has been disclosed in JP-A-73906/1999 by the present inventors and in other documents, has been suggested. This type of technology, which performs exposure by exposing a resist layer applied on a substrate to an electron beam while applying a voltage between a scanning probe and the substrate, can achieve higher resolution and feature sizes on the order of 10 nm. Furthermore, as shown in Characteristics of scanning-probe lithography with a current-controlled exposure system by M. Ishibashi et al., Appl. Phys. Lett. 72(13) 30 Mar. 1998 pp. 1581-1583, a device that can keep the exposure current constant by increasing and decreasing the voltage applied has been developed to provide pattern writing with higher reproducibility.

SUMMARY OF THE INVENTION

To expose resist patterns with high resolution and stability, feedback processing under closed-loop control for regulating the exposure current to keep it constant, as mentioned above, is indispensable. There is always stray capacitance between a scanning probe and a substrate, however; therefore, if the voltage applied is changed to respond to changes in current setting values and the film thickness of the resist, charge or discharge current flows to or from the stray capacitance in addition to the exposure current that actually flows in the resist, interfering with the change in voltage. Therefore, it takes much longer for the exposure current to reach the desired value, and it is virtually impossible to expose complicated patterns requiring frequent repetitive on/off switching of the current.

The present invention focuses on the fact that, when an alternating-current (AC) voltage is applied between a probe and substrate, even if the amplitude is changed, the voltage operates so that charge or discharge current flowing to and from the stray capacitance averages out to zero over time. More specifically, if an AC voltage is used as the applied voltage for exposing the pattern, the charge or discharge current flowing to or from the stray capacitance becomes an alternating current. Since the current-voltage characteristic of the resist layer is not linear and current does not flow therein unless the voltage exceeds a threshold, if the amplitude center of the AC voltage is set to a value in the vicinity of the threshold, exposure current flows through the resist layer only on either the positive or negative side of the AC waveform. Therefore, if the detected current flowing in the resist layer is averaged over time using a filter, the charge or discharge current offset becomes zero, whereby only the value of the exposure current to which the resist is actually exposed can be measured. If the detected exposure current is controlled by feedback so as to be kept constant while the amplitude of the applied AC voltage is changed, it is possible to control the value of the exposure current without having this value be affected by the stray capacitance in the resist layer and accordingly to expose patterns faster.

BRIEF DESCRIPTION OF THE DRAWINGS

In the attached drawings:

FIG. 8A is a drawing showing an applied AC voltage; FIG. B is a drawing showing current that flows in a resist layer and the charge and discharge current; FIGS. 8C and 8D are drawings showing trigger signals for sample and hold operations;

DESCRIPTION OF THE PREFERRED EMBODIMENT

First Embodiment

In this section, an example of an electron exposure device using AC voltage and DC voltage in combination to write patterns on a resist film will be described, with reference to FIGS. 1 to 6. In this embodiment, the amplitude center of the AC voltage is set to a value in the vicinity of a threshold value of the resist film.

Figure 1:
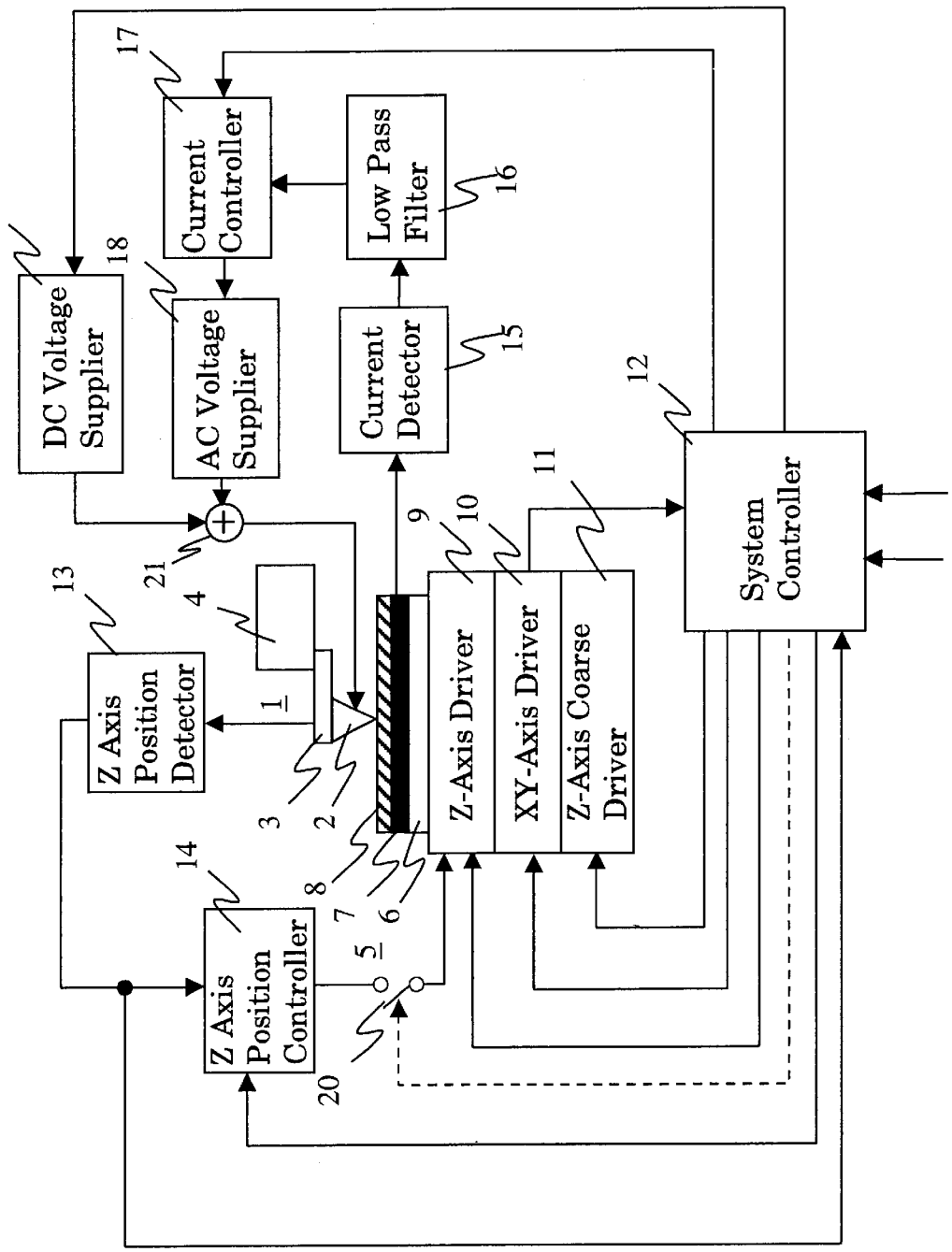
FIG. 1 is a block diagram showing the structural concept of a first embodiment of an electron exposure device according to the present invention.

FIG. 1 is a block diagram schematically showing the structure of the first embodiment of an electron exposure device according to the present invention. Reference numeral 1 indicates a writing head unit, in which an electrically-conductive scanning probe 2 is held at an end of an electrically-conductive spring suspension 3, the other end of the electrically-conductive spring suspension 3 being held by a holder 4. Reference numeral 5 indicates a specimen, which in this embodiment includes a resist layer 8 applied on a conductive layer 7 disposed on a substrate 6. The resist layer 8 of the specimen 5 is placed facing the scanning probe 2. The specimen 5 is supported by a Z-axis driver 9 and XY-axis driver 10, which perform horizontal and vertical scanning by moving the specimen 5 relative to the position of the scanning probe 2. The Z-axis driver 9 and XY-axis driver 10 are mounted on a Z-axis coarse driver 11 by which the specimen 5 can be moved coarsely in a direction perpendicular to the scanning probe 2. Reference numeral 13 indicates a Z-axis position detector of the optical-lever or another applicable type, which is disposed so as to be able to detect the position or displacement of the spring suspension. The Z-axis position detector 13 detects the relative position of the scanning probe 2 in a vertical direction from the resist layer 8, or the force applied between the scanning probe 2 and the resist layer 8.

Reference numeral 12 indicates a system controller, which receives signals indicating the pattern written on the resist layer 8, settings of exposure current, forces applied between the scanning probe 2 and the resist layer 8 and other required signals as settings, and also receives required feedback signals and outputs signals for performing feedback control so that detected writing current is kept constant. Reference numeral 14 indicates a Z-axis position controller that adjusts the Z-direction displacement of the Z-axis driver 9 during exposure of a pattern by using a position signal detected by the Z-axis position detector 13 and setting values sent from the system controller 12. The signal from the Z-axis position controller 14 is turned off by a switch 20 in a pre-processing stage of the exposure in which the scanning probe 2 and the resist layer 8 are placed in contact with each other, as will be described more specifically later. Feedback of position signals detected by the Z-axis position detector 13 and positions of the XY-axis driver 10 during exposure of the pattern are sent to the system controller 12.

Reference numeral 15 indicates a current detector that detects current flowing from the scanning probe 2 through the resist layer 8 to the electrical conductive layer 7. Reference numeral 16 indicates a low pass filter that removes high-frequency components of the current detected by the current detector 15. Reference numeral 17 indicates a current controller that sets a target current value corresponding to an XY position during exposure by using the relationship between positional feedback information sent from the XY-axis driver 10 to the system controller 12 and a signal indicating the pattern written on the resist layer 8 that is supplied to the system controller 12. Reference numeral 18 indicates an AC voltage supplier that outputs an AC voltage having an AC amplitude corresponding to the target current value set by the current controller 17. Reference numeral 19 indicates a DC voltage supplier that outputs a DC voltage corresponding to the value of the threshold voltage of the resist layer 8 that is supplied from the system controller 12. Reference numeral 21 indicates an adder that outputs a voltage in which the AC voltage output from the AC voltage supplier 18 is superimposed on the DC voltage output from the DC voltage supplier 19 and supplies the output voltage to the scanning probe 2.

Next, the operation of writing a pattern by using the device shown in FIG. 1 will be specifically described. First, the scanning probe 2 and the resist layer 8 are made to approach until one another they come into contact. Exemplary steps for this operation are the following. First, the switch 20 is turned off. While this state is maintained, a signal for moving the scanning probe 2 and the resist layer 8 toward one another by a preset distance is provided from the system control 12 to the Z-axis coarse driver 11. The result is evaluated by monitoring the output of the Z-axis position detector 13, and if it is determined that the scanning probe 2 and the resist layer 8 are not yet in contact with each other, the same operation is repeated to bring the scanning probe 2 and the resist layer 8 closer together. When it is determined from the result that they have come into contact with each other, the Z-axis coarse driver 11 has completed its operation, so the switch is turned on. As a result, a positional feedback loop comprising the Z-axis position detector 13, the Z axis position controller 14, and Z-axis driver 9 is formed, so the vertical-direction position of the scanning probe 2 is automatically controlled according to a target value provided from the system controller 12 to the Z-axis position controller 14. This feedback loop can keep the Z-direction relative position between the scanning probe 2 and the resist layer 8 at the target value even if the relative position between the scanning probe and the resist layer 8 is changed as a result of operating the XY-axis driver 10.

Next, the XY-axis driver 10 is actuated to move the scanning probe 2 on the resist layer 8, with preset current flowing from the scanning probe 2 to the resist layer 8 to write a pattern thereon. In the present invention, the DC threshold voltage of the resist layer 8 onto which the pattern will be exposed is measured. More specifically, the DC voltage at which current begins to flow from the scanning probe 2 to the electrical conductive layer 7 through the resist layer 8 is measured. To write patterns on various types of resist layers 8 with different thresholds, it is preferable to measure thresholds for each of the resist layers 8 and store the results in the system controller 12. A DC voltage with the threshold value is provided from the system controller 12 to the DC voltage supplier 19. After that, a current feedback loop comprising the current detector 15, the low pass filter 16, the current controller 17, and the AC voltage supplier 18 is turned on. A target current corresponding to required exposure current is set in the current controller 17 by the system controller 12, and the AC voltage supplier 18 adjusts the amplitude of an AC voltage waveform so that it corresponds to the target value and outputs a voltage with the adjusted amplitude. The adder 21 sums the output voltage of the DC voltage supplier 19 and the output voltage of the AC voltage supplier 18; the summed voltage is applied between the scanning probe 2 and the electrically conductive layer 7; and the desired current flows to expose the resist layer 8. The cut-off frequency of the low pass filter 16 is selected so as to remove AC frequency components added by the AC voltage supplier 18 from the current detected by the current detector 15. The AC waveform need not necessarily be a sine wave; a triangular, sawtooth, or rectangular wave may be used.

Current control by current feedback using an AC voltage according to this embodiment will be described with reference to FIGS. 2 and 3.

Figure 2:
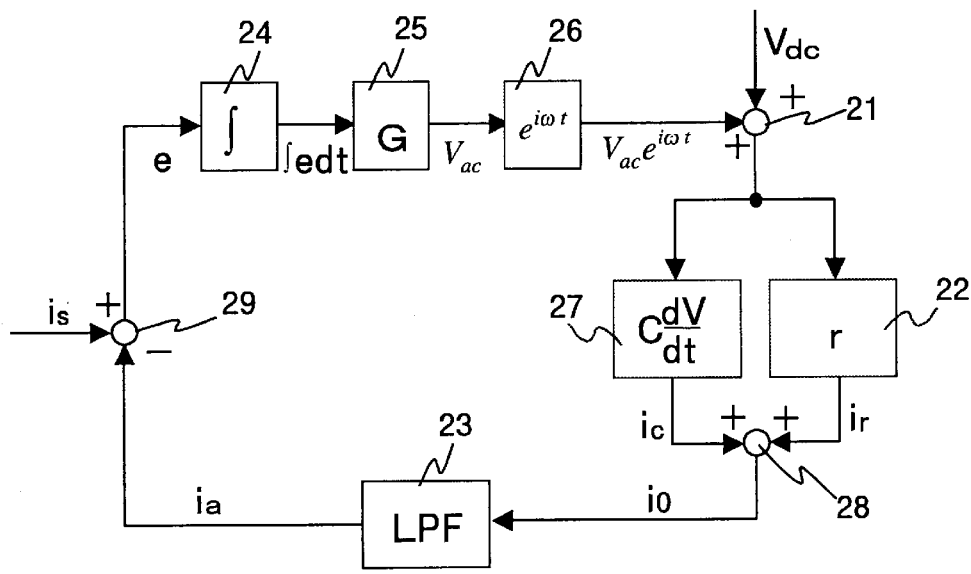
FIG. 2 is a block diagram showing a current feedback loop of the first embodiment.

FIG. 2 is a block diagram showing the current feedback loop in this embodiment. Reference numeral 27 indicates a typical stray capacitance existing between the scanning probe 2 and the resist layer 8; reference numeral 22 indicates a typical resistance existing between the scanning probe 2 and the resist layer 8. The stray capacitance 27 and resistance 22 constitute a parallel circuit, to which the adder 21 supplies the sum of the output voltage $V_{dc}$ of the DC voltage supplier 19 and the output voltage $V_{ac} \cdot e^{i\omega t}$ with the polarity shown in this drawing. Output currents ($i_c$ and $i_r$) from the stray capacitance 27 and the resistance 22, respectively, are added with the polarity shown in this drawing by an adder 28 and become $i_a$ after passing through a low pass filter 23. This feedback current $i_a$ is added with the polarity shown in the drawing by an adder 29 to a target current value $i_s$, corresponding to the XY position during exposure, that is provided from the system controller 12. The deviation e of feedback current $i_a$ from the current target value $i_s$ is time-integrated by an integrator 24; the amplitude $V_{ac}$ of the applied AC voltage is determined in a gain adjustor 25. An AC voltage $V_{ac} \cdot e^{i\omega t}$ with the determined amplitude is output from an oscillator 26 and added to the DC voltage $V_{dc}$, and the resulting voltage is applied to the stray capacitance 27 and the resistance 22 of the resist layer 8. Incidentally, ω is the angular frequency of the AC voltage.

If the voltage represented by equation (1) is applied between the scanning probe 2 and the electrically-conductive layer 7, the current $i_c$ that flows in the stray capacitance 27 is represented by the product of the capacitance C and time-differentiated voltage dV/dt, or C.dV/dt, resulting in the current represented by equation (2), while the current that flows in the resistance 22 (resistance value r) in the $$V = V_{ac} e^{i\omega t} + V_{dc} \quad (1)$$

$$i_c = C \frac{dV_{ac}}{dt} e^{i\omega t} + i\omega V_{ac} e^{i\omega t} \quad (2)$$

resist layer 8 becomes $i_r = V/r$.

Next, the sum of these currents $i = i_c + i_r$ passes through the low pass filter 23, which has a cut-off frequency less than ω, but since the current $i_c$ originating from the stray capacitance 27 has no DC component, its value becomes substantially zero. The current-voltage characteristics of the resist layer 8 is not generally linear, however, so if an appropriate DC applying voltage is selected, it is possible to cause current to flow in one direction. This will be described with reference to FIG. 3.

Figure 3:
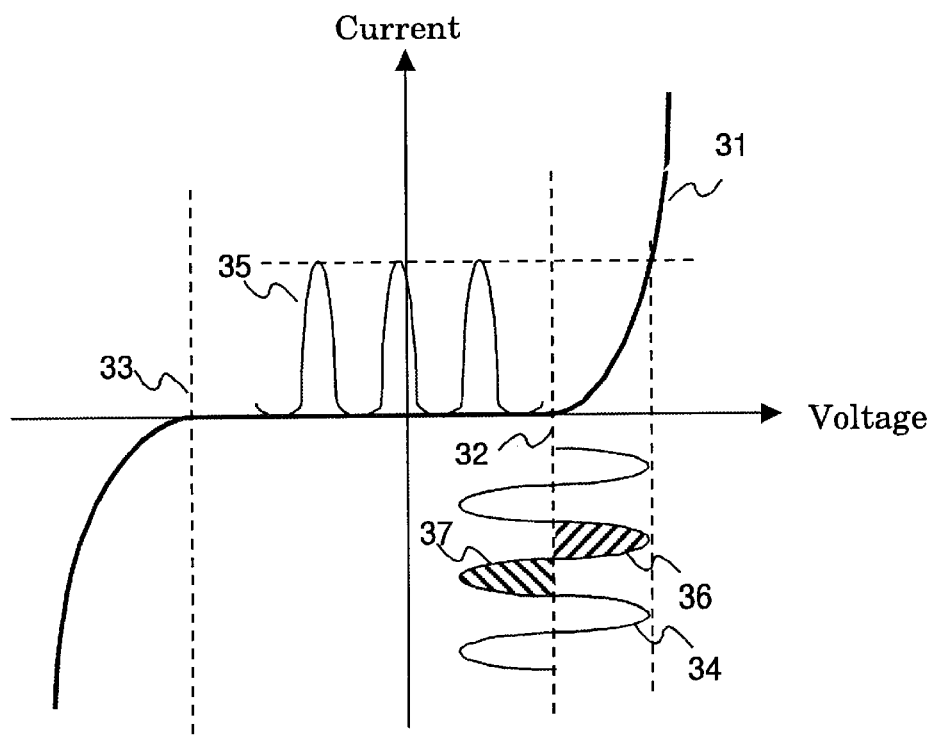
FIG. 3 is a schematic drawing showing the current-voltage characteristic and voltage-current relationships of a resist layer 8.

FIG. 3 is schematically shows the current-voltage characteristic of the resist layer 8; the horizontal axis indicates the amount of applied voltage and the vertical axis indicates the amount of current. The characteristic curve 31 indicates that no current flows in the low voltage region, and current begins to flow suddenly when the voltage exceeds a positive threshold voltage 32 or a negative threshold voltage 33. In this example, the positive threshold voltage 32 is smaller than the negative threshold voltage 33 in absolute value. If the applied DC voltage $V_{dc}$ supplied by the DC voltage supplier 19 is set to a value close to the value of the positive threshold voltage 32, and an AC voltage waveform 34 is caused to oscillate around the set value, current flows in the positive half period 36 and no current flows in the negative half period 37, yielding current $i_r$ with a waveform such as a current waveform 35. An average value $i_a$ of the current that flows in the resist layer 8 can be obtained by passing this current through the low pass filter 23. It is possible to keep the average value $i_a$ of the current that flows actually through the resist layer 8 at a desired set target current value by feedback to the amplitude of the AC voltage via the integrator 24 so that the deviation between the current $i_a$ and the desired set current value $i_s$, $e = i_s - i_a$, become zero. Although this embodiment describes the case in which the deviation e is integrated by the integrator 24 and integral control is used, proportional control or proportional-integral control may also be used. Setting the DC apply voltage $V_{dc}$ close to the value of the negative threshold voltage 33 can reverse the direction of flow of current $i_a$. Needless to say, that the desired set current value $i_s$ is the amount necessary for the resist layer 8 to be exposed, but in the example shown in FIG. 3, the maximum value of the amplitude of an AC voltage in the negative half period 37 satisfying the condition that current flows in the positive half period 36 and not in the negative half period 37 is equal to the sum of the positive threshold voltage 32 and negative threshold voltage 33, so current $i_a$ corresponds to sufficiently large setting current value $i_s$.

Figure 4:
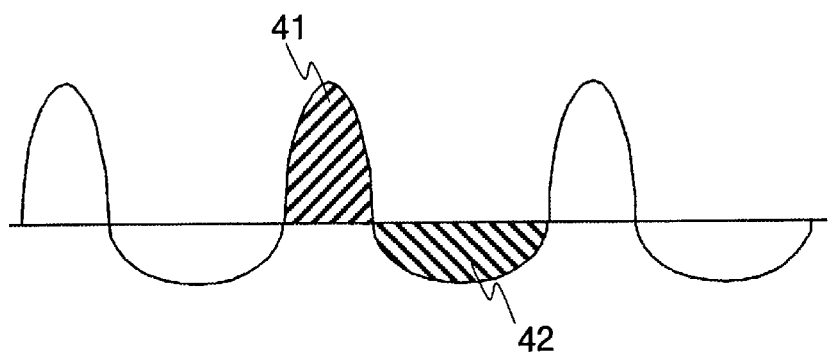
FIG. 4 is a drawing showing an example of applied an voltage waveform having asymmetric positive and negative half periods.
Figure 5:
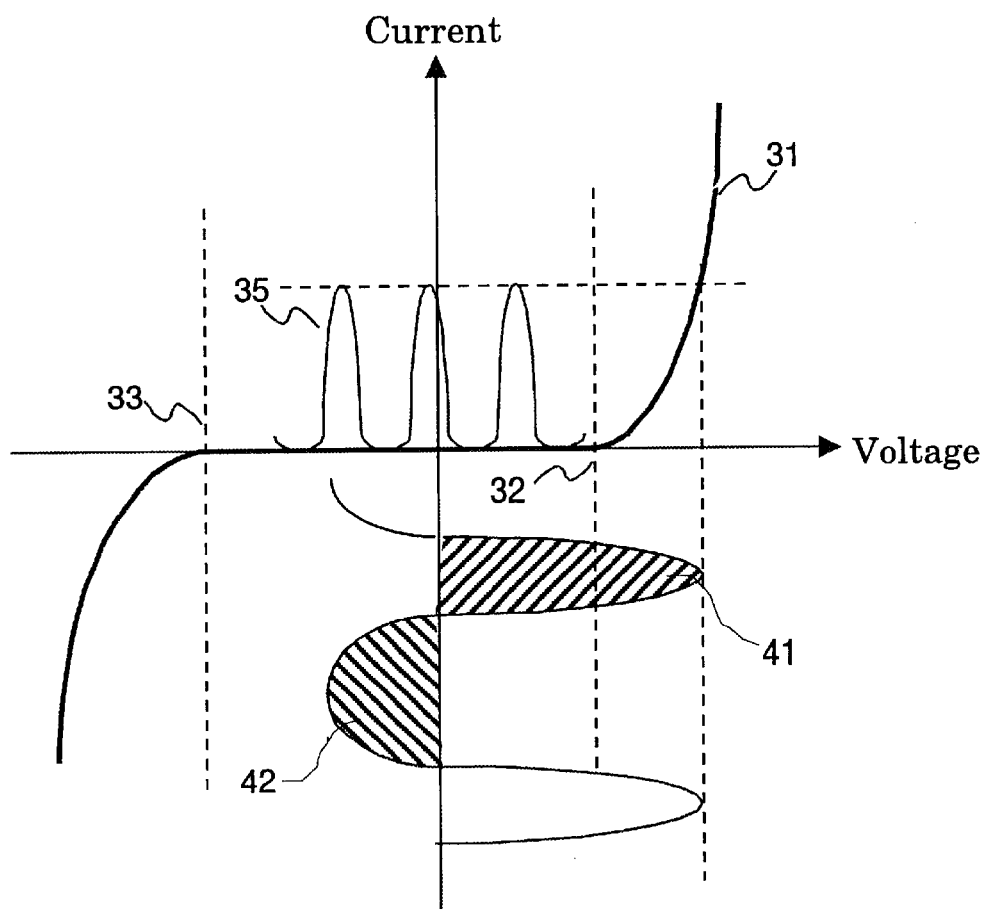
FIG. 5 is a schematic drawing showing the current-voltage characteristic of the resist layer 8 and voltage-current relationships when the applied voltage has asymmetric positive and negative half periods.

The AC voltage waveform need not be a positive-negative symmetrical waveform; any waveforms may be used if they are periodic and the time-integrated value becomes zero over one period. As shown in FIG. 4, even if the waveforms of the positive half period 41 and negative half period 42 are asymmetric, for example, these may be used if their areas are equal. Using the waveform shown in FIG. 4, if the amplitude ratio of the positive half period 41 to the negative half period 42 is set to the ratio of the maximum positive output voltage value to the negative threshold voltage 33, since the amplitude of the negative half period 42 does not reach the negative threshold voltage 33, no negative-direction current flows, thereby enabling current control by feedback even if no applied DC voltage $V_{dc}$ is used. FIG. 5 shows the relationships between the current and the threshold value in association with the drawing in FIG. 3. The direction of the current flow can be reversed if the amplitude ratio of the positive half period 41 and negative half period 42 is set to the ratio of the positive threshold voltage 32 to the maximum value of the output voltage in the negative half period 41.

An asymmetric waveform as shown in FIG. 4 can be generated in consideration of the areas of the positive half period 41 and the negative half period 42, but it is difficult to generate waveforms that time-integrate to zero. Therefore, a simple waveform generating method will be described with reference to FIG. 6.

Figure 6:
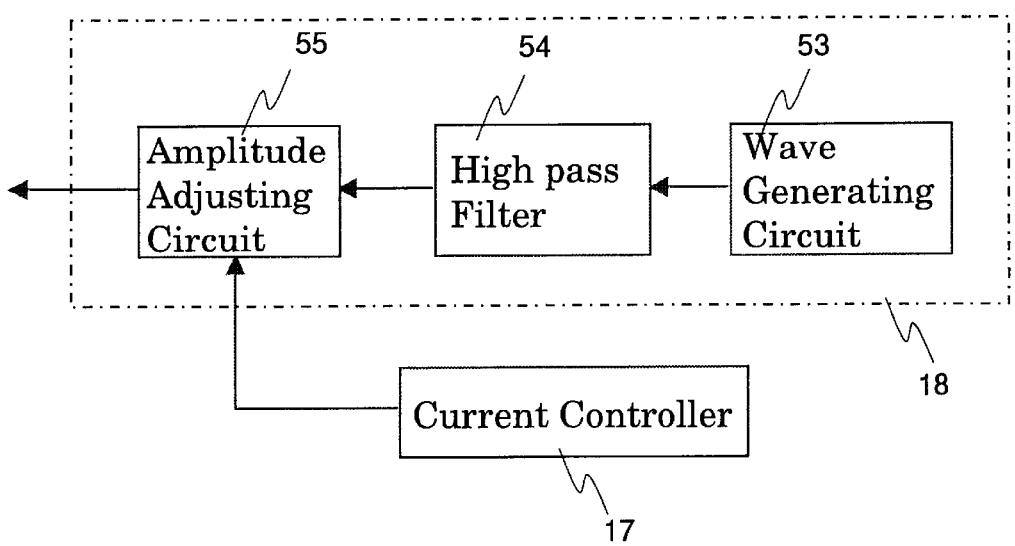
FIG. 6 is a block diagram showing a wave generating circuit for generating asymmetric waveforms and a device for applying the resulting AC voltage.

FIG. 6 is a block diagram showing the AC voltage supplier 18. Saying that one period of a periodic waveform time-integrates to zero is equivalent to saying that the waveform has no DC component, so it is possible to generate a waveform that satisfies this condition by passing an AC waveform generated in a wave generating circuit 53 through a high pass filter 54 to remove the DC component. Although the time constant of the high pass filter 54 may have a value near or above the value of the frequency of an AC waveform, it is preferable to set a value low enough so as not to reduce the amplitude of the waveform. An amplitude adjusting circuit changes the amplitude obtained in this way according to signals sent from the current controller 17.

This embodiment uses piezo devices as the Z-axis driver 9 and the XY-axis driver 10 for fine tuning of the probe positions on the resist layer 8. The mechanism of the Z-axis coarse driver uses a stepper motor and a micrometer head, and may employ a lever, inchworm, or another applicable method. Although this embodiment mounts the specimen 5 on the side of the Z-axis driver 9, XY-axis driver 10, and Z-axis coarse driver 11, which are used to provide relative movement of the specimen 5 with respect to the writing head unit 1, it is also possible to place the holder 4 on the side of the Z-axis driver 9, XY-axis driver 10, and Z-axis coarse driver 11. The Z-axis position detector 13 detects position by a photo-lever method using reflection of a laser beam from the spring suspension 3, but it is also possible to detect position by changes in resistance due to distortion of a strain gauge attached to the spring suspension 3.

The substrate 6 is made of glass, on which titanium is evaporated to form an electrically conductive layer 7 with a thickness of 20 nm to 100 nm; then the resist layer 8 (such as RD2100 manufactured by Hitachi Chemical Co., Ltd.) is coated thereon with a thickness of about 10 nm to 100 nm. The resist layer 8 may be a mixed resist comprising a novolak-type phenol resin and a photosensitive agent, or a chemically amplified resist, or a polymethyl methacrylate. The substrate 6 may comprise an arbitrary material to be patterned, such as silicon or doped silicon. If the substrate 6 is made of doped silicon, the substrate 6 itself is electrically conductive, so the electrically conductive layer 7 can be omitted. The electrically conductive layer 7 is connected to the current detector 15, making it possible to measure the current flowing through the resist layer 8 due to the voltage applied to the scanning probe 2. If the substrate 6 is conductive, the current detector 15 can simply be connected to the substrate 6. The connection of an electrode to the electrically conductive layer 7 is carried out by dissolving only the resist layer 8 with acetone or another applicable organic solvent to expose the electrically conductive layer 7 and then pressing on it with a plate made of metal or another applicable material; alternatively, the connection may be made by inserting a needle-shaped electrode through the resist layer 8 and causing it to come into contact with the electrically conductive layer 7. The electrically conductive layer 7 may be grounded. In this case, current is detected by connecting the current detector 15 between the output side of the adder 21 and the scanning probe 2.

The scanning probe 2 and spring suspension 3 may be made integrally from a single silicon crystal by fine patterning, for example. Silicon oxide or silicon nitride may also be used. The radius of curvature of the tip of the scanning probe 2 is preferably 10 nm to 100 nm; the spring modulus is 0.05 N/m to 5 N/m; the resonance frequency is 10 kHz to 50 kHz. A titanium film 10 nm to 50 nm in thickness is deposited on the scanning probe 2 to provide conductivity. Materials other than titanium, such as tungsten, molybdenum, titanium carbide, tungsten carbide, and conductive diamond, may also be used to provide conductivity.

Results of pattern writing tests according to this embodiment will now be described. As the substrate 6, a conductive silicon substrate was used, on which a resist layer 8, 50 nm in thickness, was formed by coating the RD2100N resist mentioned above, so the electrically conductive layer 7 was not used. First, the current-voltage characteristic between the scanning probe 2 and the resist layer 8 was measured while the output voltage of the DC voltage supplier 19 was varied with current feedback turned off. The negative threshold voltage was on the order of −30 V and the positive threshold voltage was on the order of +50 V. A pattern was written by applying −30 V from the DC voltage supplier 19 and an AC voltage at a frequency of 100 kHz from the AC voltage supplier 18, with current feedback so that the current flowing between the scanning probe 2 and the substrate 6 (the current signal output from the low pass filter 16) was 30 pA while the scanning probe 2 was moved at a speed of 0.1 mm/s. The amplitude of the applied AC voltage was in the neighborhood of 10 V. After the pattern writing was completed, the resist layer 8 was immersed and developed in a 0.83 percent tetramethylammonium hydroxide solution for one minute to obtain the resist pattern.

When a 100-nm pitch line-space pattern was written in a 0.1 square mm region, a clear line pattern with approximately 50 nm line width was obtained. A latency of 1 ms was provided at the beginning of the line writing, in consideration of the rise time of the feedback current. The wiring time in this case was 2000 s. For comparison, a similar pattern was written with current feedback being applied with only a DC voltage. As a result of a latency of 3 s being provided to take the rise time of the feedback current into consideration, writing the entire pattern took 5000 s, and at the beginning of the writing of the pattern, since the detected current included the current that flowed into the stray capacitance 27, so the pattern received too little current exposure, resulting in lines of varying thickness.

Next, two-dimensional dot arrays were written with a 100-nm pitch in a 0.1 square mm region by using AC voltage feedback. The current value for writing each dot was set at 30 pA, the dwell time was set to 1 ms, and the current value for moving to the adjacent dot was set at 0 pA. After writing and moving operations were repeated based on these settings, a pattern of dots approximately 50 nm in diameter was obtained. The total writing time was approximately 3000 s.

If a similar dot array pattern were to be written by applying current feedback with only a DC voltage, since a latency of about 3 s is required for the current value to become stable every time a dot is written, the total writing period required is calculated to be about one month. In addition, it would be difficult to write the dots, because each dot would be continuously exposed and might become too large by the time the current had stabilized.

Pattern writing using asymmetric waveforms as shown in FIG. 4 was also carried out. This test was conducted using negative voltages for writing, using a sine wave having a period of 3.3 μs for the negative half period 41 and a period of 6.7 μs for the positive half period 42, the positive amplitude being half the negative amplitude, with no DC apply voltage being used for applying a threshold voltage. With a target current value set to 30 pA, the amplitude of the negative AC voltage was approximately 40 V. Similar to the case with symmetric waveforms, a 0.1 mm square 100-nm pitch line-space pattern and a two-dimensional 100-nm pitch dot array were written. The same result was obtained as with the sine wave.

When this embodiment applied current feedback by changing the amplitude of an AC voltage to write a line-space pattern with 100-nm pitch and 50-nm line width in a 0.1 mm square region, the operation was completed 2.5 times faster and with less variation in line width than with current feedback using DC voltage only. In addition, this embodiment enabled fast writing of a dot array pattern, which would be impossible by using conventional current feedback with only a DC voltage.

This embodiment makes it possible to apply faster current feedback with AC voltages at higher frequency, and especially at 1 kHz to 1 MHz, it can provide stable pattern writing. Furthermore, if the threshold voltage of the voltage polarity used to write the pattern is sufficiently lower than the opposite polarity threshold voltage, even if asymmetric waveforms as shown in FIG. 4 are not used, it is not necessary to supply a DC voltage from the DC voltage supplier 19.

Second Embodiment

Figure 7:
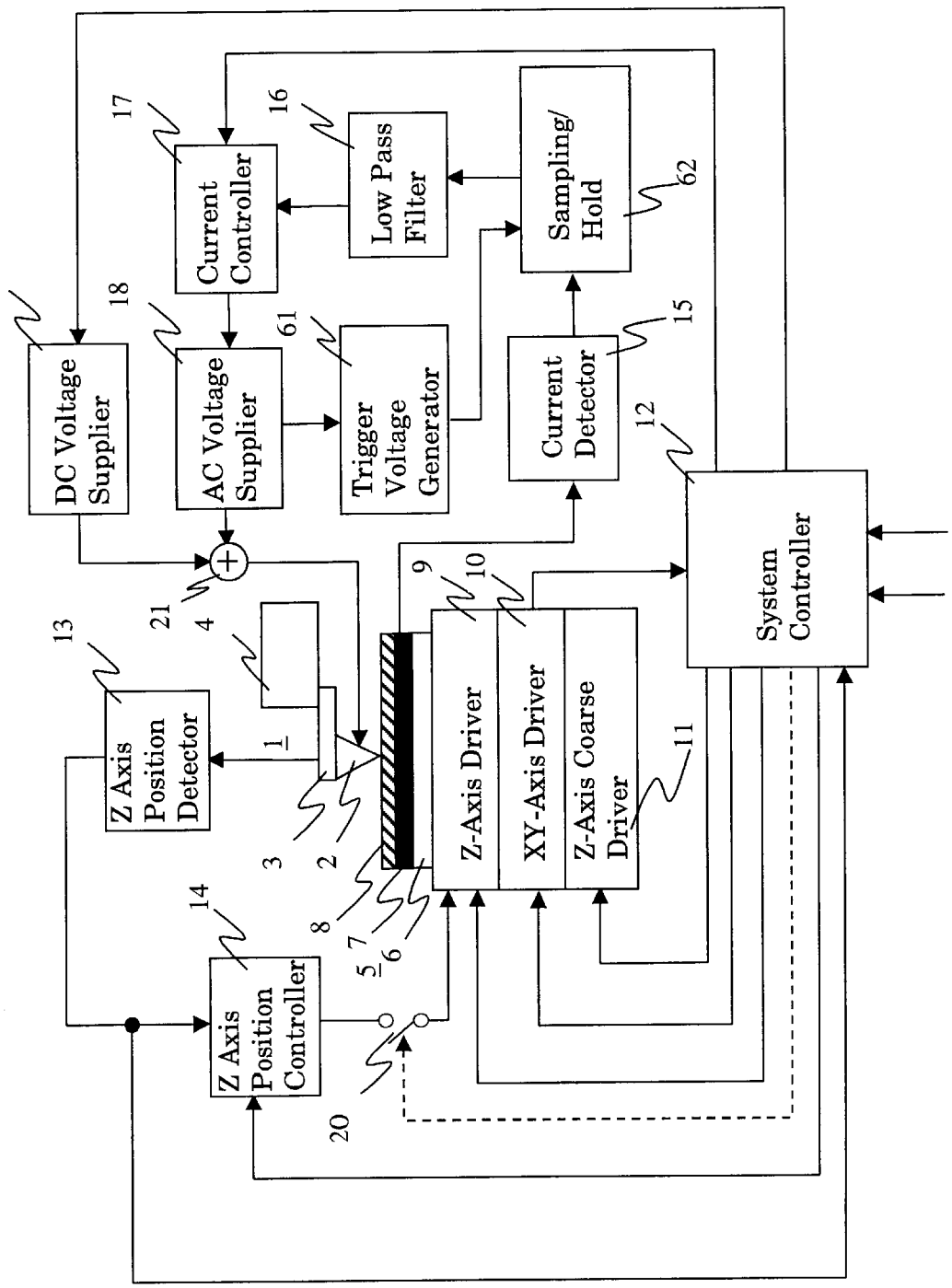
FIG. 7 is a block diagram showing the structural concept of a second embodiment of an electron exposure device that writes a pattern on a resist film by using an alternating current and a sample-hold circuit.

In this embodiment, an exemplary electron exposure device that writes patterns on a resist film by using AC voltage and a sample and hold circuit will be described with reference to FIGS. 7 and 8. FIG. 7 is a block diagram schematically showing the structure of the embodiment of an electron exposure device according to the present invention. This embodiment is not essentially different from the electron exposure device of the first embodiment shown in FIG. 1, except that the output terminal of current detector 15 is connected to a sampling/hold circuit 62, to which a trigger voltage is output from a trigger voltage generator 61 in synchronization with an AC apply voltage that is output from the AC voltage supplier 18 and the current signal is held therein.

Figure 8A:
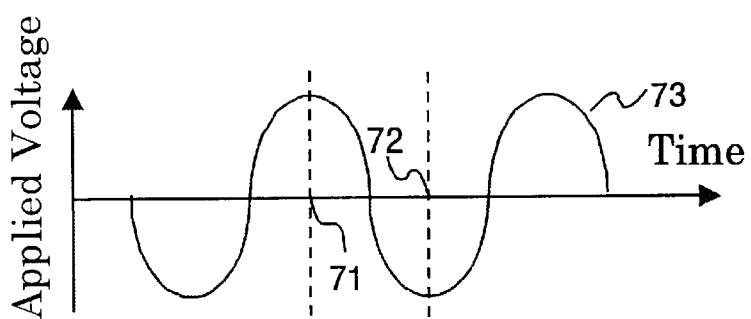
FIGS. 8A to 8D are drawings illustrating a method of detecting current in the second embodiment shown in FIG. 7.
Figure 8B:
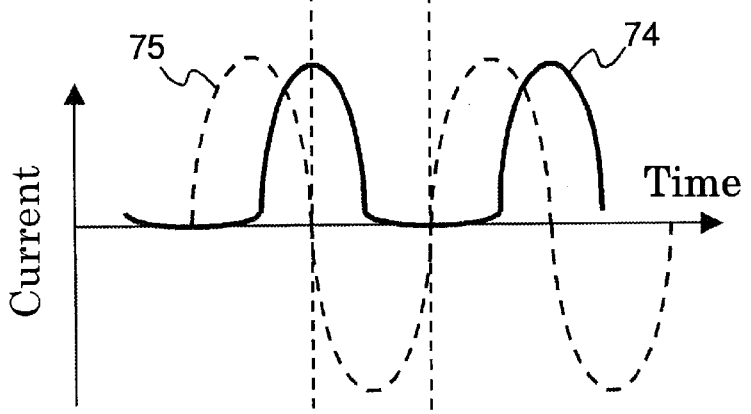

Next, the method of detecting current will be described with reference to FIG. 8. FIG. 8A shows the time-varying AC voltage output from the AC voltage supplier 18, and FIG. 8B shows the time-varying amount of current that flows at the corresponding time. If the AC voltage waveform 73 is a sine wave, the positive voltage reaches its peak at time 71, and the negative voltage reaches its peak at time 72. At this time, the waveform 74 of the effective current that flows between the scanning probe 2 and the resist layer 8 is the waveform shown with a solid line, which reaches its peak at time 71, and no current flows in the negative half period of the AC voltage waveform 73. The charge or discharge current waveform 75 is shown with a dotted line; this curve is a sine wave positively shifted 90 degrees in phase from the AC voltage waveform 73. Accordingly, the charge or discharge current waveform 75 becomes zero at time 71 and 72, and at this time, the current detector 15 outputs only the value of the effective current 74. Therefore, the sampling/hold circuit 62 retains current values at time 71 or time 72, thereby making it possible to obtain a current value that does not contain charge or discharge current.

Figure 8C:
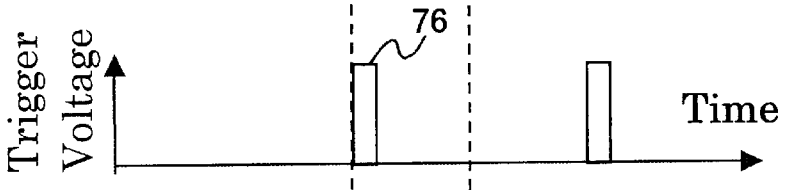

FIG. 8C shows trigger signals that the trigger voltage generator 61 supplies to the sampling/hold circuit 62; at the positive peak time of the AC voltage waveform 73, or in synchronization with time 71, pulse 76 is output, and in synchronization with the rising time of the pulse 76, the sampling/hold circuit 62 retains the present current value. Therefore, the sampling/hold circuit 62 always outputs the peak value of the effective current waveform 74. On the other hand, since the charge or discharge current waveform 75 changes abruptly at time 71 and time 72, if current values are retained only at the positive peak time of the AC voltage waveform 73, the charge or discharge current is also retained due to slight deviation of the pulse 76, making it impossible to detect correct peak effective current values.

Figure 8D:
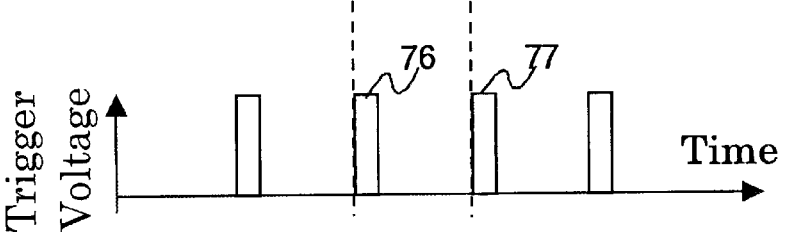

FIG. 8D shows trigger signals which can be generated to solve this problem by having pulse 77 output not only at the positive peak time of the AC voltage waveform 73 but also at the negative peak time thereof, or at time 72. Since the charge or discharge current has a sinusoidal waveform, if the phase is shifted by one half period, or 180 degrees, the signal is reversed in polarity while keeping the same amplitude. Time 71 and time 72 are synchronized with the AC voltage waveform 73, so they are mutually shifted by accurate half periods, and even if the pulses 76 and 77 are incorrectly timed, the values of charge or discharge current at time 71 and time 72 are always identical in absolute value with reversed polarity, so they cancel each other out and are not contained in the detected current.

The sampling/hold circuit 62 outputs the peak value of the effective current at time 71, but outputs zero at time 72 because the effective current at that time becomes almost zero. If the waveform is passed through the low pass filter 16, half the peak value is output. Adjusting the phase of the pulses 76 and 77 to the AC voltage waveform 73 so that the output value becomes the maximum enables the correct peak values to be obtained. If current feedback is applied by using peak values obtained in this way, exposure can be carried out while a constant peak value is maintained.

The operations for pattern writing by the device shown in FIG. 7 are entirely identical to those for the device shown in FIG. 1. When this embodiment was tested by writing a line-space pattern and a dot array pattern as in the first embodiment, with a writing head unit 1 and a specimen 5 identical to those used in the first embodiment, a 10 kHz AC applied voltage, the trigger signals shown in FIG. 8D for detecting peak current values, and a current setting of 100 pA, the same results were obtained as in the first embodiment. Similar pattern writing quality was also achieved by using the trigger signals shown in FIG. 8C.

As a result of writing a 100-nm pitch and 50-nm-wide line-space pattern in a 0.1 square mm region by applying current feedback with detected AC peak values that flowed when AC voltage was supplied, this embodiment achieved 2.5-times faster operation and smaller variation of line width than by current feedback using DC voltage. In addition, this embodiment can quickly write a dot-array pattern, which would be impractical with conventional DC feedback.

Third Embodiment

Figure 9:
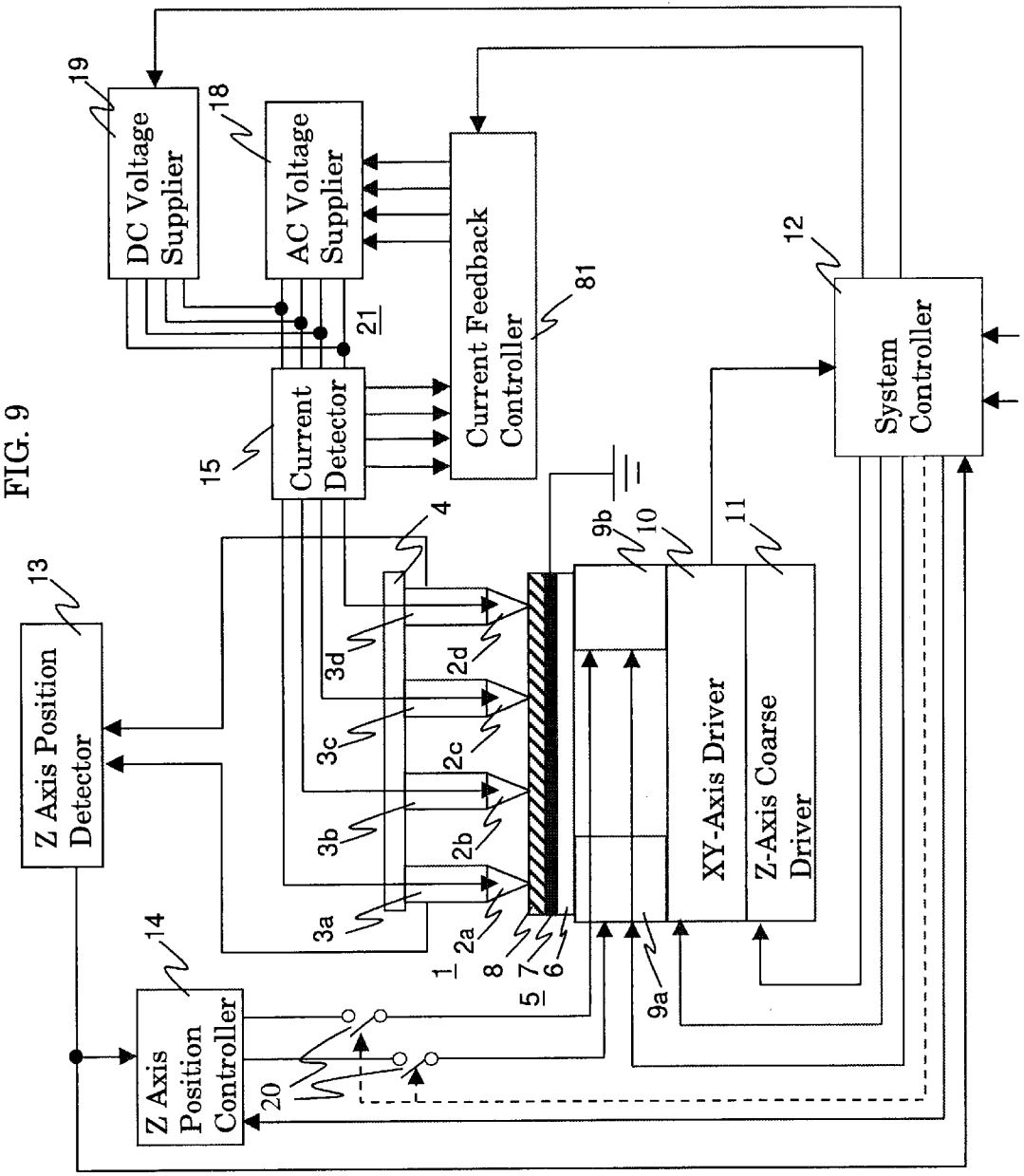
FIG. 9 is a block diagram showing the structural concept of a third embodiment of an electron exposure device that writes patterns with a plurality of scanning probes.

In this embodiment, an exemplary pattern writing device that writes patterns on a resist film with a plurality of scanning probes will be described with reference to FIG. 9. This embodiment applies the present invention to a lithography device using a scanning probe microscope with a plurality of one-dimensionally arranged conductive scanning probes $2a$ to $2d$ secured to a common holder 4 via a plurality of spring suspensions $3a$ to $3d$, respectively, as disclosed in JA-A-73906/1999. The device according to this embodiment is not essentially different from the pattern writing device according to the first embodiment shown in FIG. 1, except that the plurality of scanning probes $2a$ to $2d$ are separately connected to the adder 21 via the current detector 15 so that it is possible to supply voltage to the scanning probes $2a$ to $2d$ and detect current thereof separately and concurrently. In addition, the spring suspensions $3a$ and $3d$ at both ends are connected to the Z-axis position detector 13, in which, when the switch is turned on, the Z-axis positions of the scanning probes $2a$ and $2d$ from the surface of the resist layer 8 are detected, and two Z-axis drivers $9a$ and $9b$ are displaced based on these signals, whereby the Z-axis positions of all the scanning probes $2a$ to $2d$ are adjusted to desired values. Elements appearing in both this and the preceding embodiments are shown with like reference numerals.

Next, operations for carrying out pattern writing by using the device shown in FIG. 9 will be described. First, while the scanning probes $2a$ to $2d$ are being brought into initial contact with the resist layer 8, the switch 20 is turned off as in the embodiment shown in FIG. 1; the two z-axis drivers $9a$ and $9b$ are extended according to commands from the system controller 12, and when the resist layer 8 makes contact with any one of the scanning probes $2a$ or $2d$, the switch is turned on to shift to closed loop control. Two independent position feedback loops consisting of the Z-axis position detector 13, Z-axis position controller 14, and Z-axis driver $9a$ and the Z-axis position detector 13, Z-axis position controller 14, and Z-axis driver $9b$ automatically control the Z-axis positions of the scanning probes $2a$ and $2d$, so even if the line between the tips of the scanning probes $2a$ and $2d$ is not parallel to the surface of the resist layer 8, they are automatically adjusted to become parallel, making it possible to cause the scanning probes $2a$ to $2d$ to come into contact with the surface of the resist layer 8 with an almost uniform force. The scanning probes may be two-dimensionally arranged as disclosed in JP-A-73906/1999, and in this case Z-axis position feedback is carried out for three scanning probes, the tips of which are not collinear, by using three Z-axis drivers corresponding to the positions of these three scanning probes, making it possible to bring the two-dimensional array of scanning probes into contact with the surface of the resist layer 8 with a uniform force. After the scanning probes $2a$ to $2d$ come into contact with the surface of the resist layer 8, a current feedback controller 81 controls the amplitude of an AC voltage as in the first embodiment to write patterns. The current feedback controller 81 may control feedback current according to the current amount as described in the first embodiment or to peak current values as described in the second embodiment. Needless to say, the current feedback controller 81 includes a low pass filter and a current controller corresponding to each scanning probe as shown in FIG. 1.

According to this embodiment, a pattern was written in a 1 square mm region by using a ten by ten matrix of 0.1-mm pitch scanning probes and respective spring suspensions made of monocrystalline silicon with conductivity provided by evaporating titanium thereon, so that there were 100 scanning probes arranged in a matrix. The conductive silicon substrate was coated with a 50-nm thickness of RD2100N resist. The current flowing through each scanning probe was set at 30 pA, and each scanning probe was moved in a range of 0.1 square mm at a velocity of 0.1 mm/s to write the pattern. Both exposure beam amount control and peak current value control enabled a clear resist pattern to be written. If a pattern is written with a two-dimensional 10000 by 10000 matrix of 10-μm pitch scanning probes moving at a velocity of 0.1 mm/s, forty 300-mm wafers per hour can be processed.

This embodiment uses 100 two-dimensionally arranged scanning probes to write patterns with an AC voltage thereby making it possible to provide an electron exposure device that can expose resist patterns faster than a device with one scanning probe.

Fourth Embodiment

Figure 10:
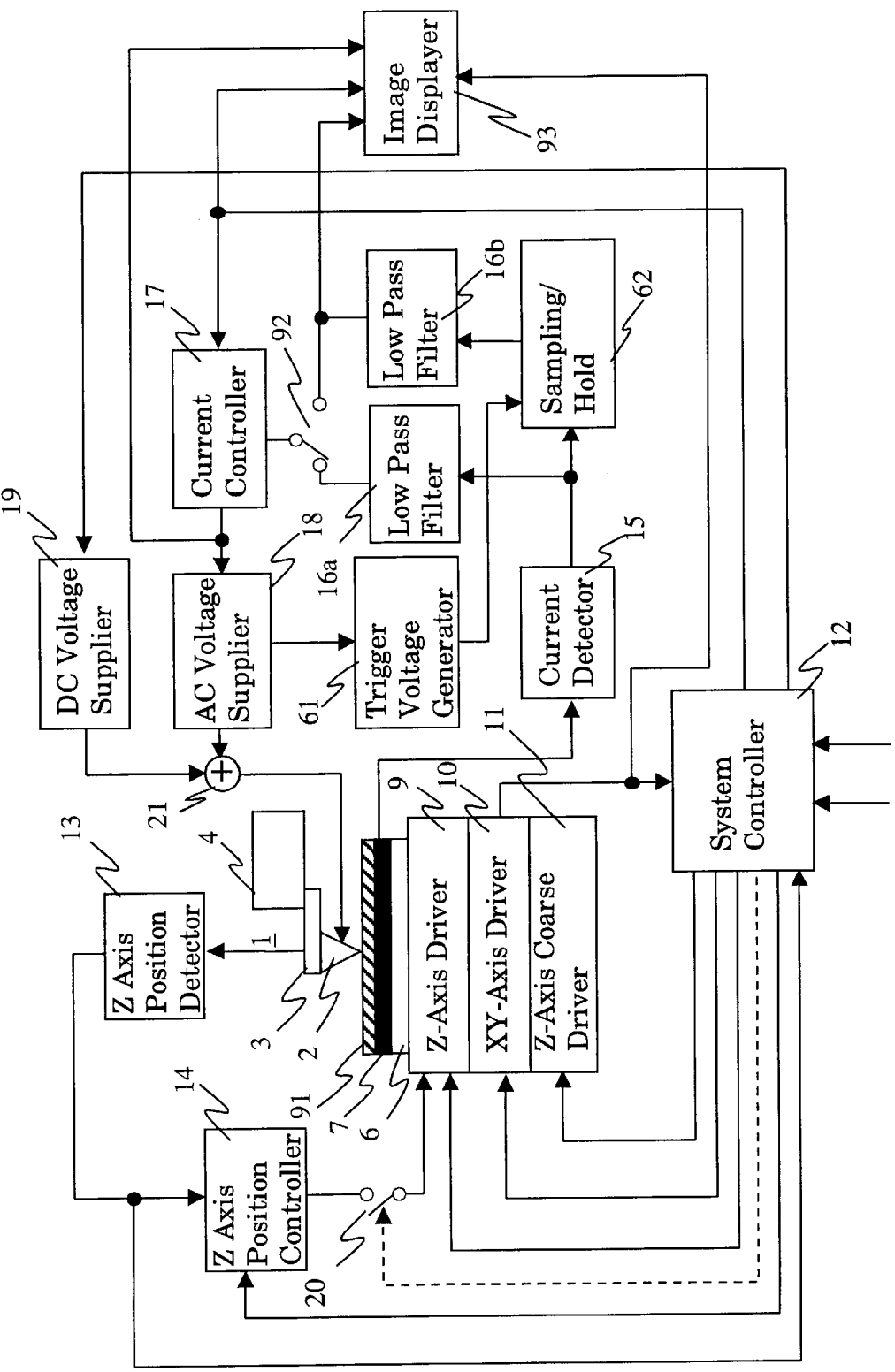
FIG. 10 is a block diagram showing the structural concept of a fourth embodiment of an electric characteristics evaluation device that evaluates leakage current of an insulating film.

In this embodiment, an example of a device for evaluating electric characteristics that evaluates leakage current of insulation films will be described with reference to FIG. 10. This embodiment does not differ in current flow from the electron exposure devices of the first and second embodiment shown in FIGS. 1 and 7, respectively, but the uppermost layer of the specimen 5 is an insulation layer 91 instead of a resist layer 8. Both the current detecting mechanisms shown in FIGS. 1 and 7 are provided so as to be able to detect both exposure current amount and peak current values. Therefore, two low pass filters 16a and 16b are provided. In addition, these output values are input to the current controller 17 by using a switch 92 so that it is possible to apply current feedback by using either current exposure amount or peak current values. Furthermore, XY-axis position signals, current setting values, peak current values and applied voltage values that are sent to the system controller 12 can be used to display a mapping of the insulation resistance of the insulation layer 91.

Next, operations for pattern writing using the device shown in FIG. 10 will be described. First, the switch 20 is turned off and the Z-axis coarse driver 11 is used to cause the scanning probe 2 and the insulation layer 91 to move closer to one another until they come into contact with one another. When it is detected that they have come into contact one another, the switch 20 is turned on to automatically control the Z-axis position of the scanning probe 2 through a Z-axis position feedback loop consisting of the Z-axis position detector 13, the Z-axis position controller 14, and the Z-axis driver 9. The relative Z-axis position between the scanning probe 2 and the insulation layer 91 can thus be maintained even if the relative position between the scanning probe 2 and the insulation layer 91 is changed by the operation of the XY-axis driver 10. The insulating layer 91 is evaluated by moving the scanning probe 2 thereon while passing a preset current from the scanning probe 2 thereinto. Before starting the evaluation, a threshold voltage value at which current starts flowing from the scanning probe 2 to the insulating layer 91 is measured, and a DC voltage in the vicinity of the threshold value is supplied to the scanning probe 2 from the DC voltage supplier 19 for the evaluation. After that, a current feedback loop consisting of the current detector 15, current controller 17, and AC voltage supplier 18 is turned on and the system controller 12 sets a desired current value of in the current controller 17; then the amplitude of the AC voltage waveform output from the AC voltage supplier 18 is adjusted to pass current with the desired value. The current feedback may be applied by using either the current exposure amount or the peak current value. If the amount of current exposure is used, a mapping image of resistance values in the range of the measurement can be obtained by previously monitoring the value of the amplitude of the applied AC voltage at a target XY-axis position and the peak current value at the time, calculating the resistance value of the insulating layer 91 using these values, and mapping the resultant value at each XY-axis position. An image corresponding to insulation resistance of the insulating layer 91 can also be obtained by mapping the amplitudes of the applied AC voltages. On the other hand, in the case of applying current feedback by using peak current values, since the peak current value is constant, the amplitude of the AC voltage directly corresponds to the resistance value of the insulating layer 91. The resistance values may be calculated by using peak current values. In general, there is a possibility that the insulating layer 91 may experience dielectric breakdown due to high electric field, so it is preferable to set a maximum value for the voltage feedback.

This embodiment scanned the surface of a 5-nm-thick silicon oxide film used for the gate oxide film of a MOS transistor across a 10 square μm region while applying current feedback so that the peak current value was 1 pA, and obtained a mapping image of the resistance values. Identical quality could be obtained with current feedback by using the amount of current exposure. In addition, a mapping image of resistance values of identical quality could be achieved for a 0.8-nm-thick aluminum oxide film using a tunneling magnetoresistive (TMR) head.

In this embodiment, the AC voltage was adjusted to keep the amount of current exposure or the peak value of the AC current constant, while the film-thickness-direction insulation resistance of a 5-nm-thick silicon oxide film and a 0.8-nm-thick aluminum oxide film were measured. As a result, a mapping image of the insulation resistance was obtained at a comparatively high speed without causing dielectric breakdown.

Other embodiments

The embodiments described above represent each control function in a separate block only to make it easy to understand the operation, so, needless to say, these functions can be appropriately integrated and implemented in software operating on a personal computer or other computing device. Feedback of the operation of the XY-axis driver 10 may be omitted.

In addition, the present invention can be implemented in the following embodiments.

1. An electron exposure device for causing a scanning probe to scan the surface of a substrate while supplying current therebetween to write desired patterns on the substrate, comprising a current detector that detects current flowing through the substrate; a low pass filter that removes AC components of the detected current; an AC voltage supplier that applies AC voltages between the scanning probe and the substrate; a DC voltage supplier that applies a DC voltage superimposed on the AC voltage; and a current controller that determines the value of the applied voltage based on the detected current.

2. The electron exposure device described in 1 above, in which the detected current is controlled by changing the amplitude of the AC voltage.

3. The electron exposure device described in 1 above, in which, as the DC voltage, a voltage in the vicinity of a threshold voltage at which current starts flowing between the scanning probe and the substrate is applied.

4. The electron exposure device described in 1 above, in which the AC voltage waveform does not contain a DC component.

5. The electron exposure device described in 1, in which the AC voltage is obtained by passing an arbitrarily generated AC voltage through a high pass filter.

6. A method of writing patterns using an electron exposure device, comprising; a step of forming an electrically conductive layer on a major surface of a substrate; a step of forming a resist film on the electrically conductive layer; a step of applying a DC voltage between a scanning probe and the substrate; a step of applying an AC voltage superimposed on the DC voltage; a step of adjusting the amplitude of the AC voltage so as to maintain a constant flow of current between the scanning probe and the substrate constant; a step of determining, based on pattern data, the value of current supplied between the scanning probe and the electrically conductive layer and positions to which the current is supplied; a step of causing the scanning probe to scan on the resist film while supplying predetermined current at the predetermined positions to form a latent pattern; and a step of developing the resist firm to form a desired pattern on the substrate.

7. An electron exposure device for causing a scanning probe to scan the surface of a substrate while supplying current between the scanning probe and the substrate to write desired patterns on the substrate, comprising a current detector that detects current flowing through the substrate; a sample and hold circuit that retains the current; a low pass filter that removes AC components of the detected current; an AC voltage supplier that applies an AC voltage between the scanning probe and the substrate; a DC voltage supplier that applies a DC voltage superimposed on the AC voltage; a trigger voltage generator that generates trigger voltages supplied to the sample and hold circuit based on the AC voltage to retain current values; and a current controller that determines the value of the applied voltage based on the detected current.

8. The electron exposure device described in 7, in which the detected current is controlled by changing the amplitude of the AC voltage.

9. The electron exposure device described in 7, in which, as the DC voltage, a voltage in the vicinity of a threshold voltage at which current starts flowing between the scanning probe and the substrate is applied.

10. The electron exposure device described in 7, in which the trigger voltages are generated at a peak time of either the positive or negative side of the AC voltage.

11. The electron exposure device described in 7, in which the trigger voltages are generated at peak times of both the positive and negative sides of the AC voltage.

12. An electron exposure device that scans the surface of a substrate with a scanning probe while supplying current between the scanning probe and the substrate to write desired patterns, comprising a plurality of scanning probes; an AC voltage supplier that applies an AC voltage between each scanning probe and the substrate; a DC voltage supplier that applies a DC voltage superimposed on the AC voltage; a current measuring circuit that measures the value of current flowing between each of the plurality of scanning probes and the substrate; a current controller that determines the applied voltage based on the measured current value.

13. The electron exposure device described in 12, in which current flowing between each of the plurality of scanning probes and the substrate is controlled by changing the amplitude of the AC voltage.

14. The electron exposure device described in 12, in which, as the DC voltage, a voltage in the vicinity of a threshold voltage at which current starts flowing between each of the plurality of scanning probes and the substrate is applied.

15. The electron exposure device described in 12, in which the plurality of scanning probes are two-dimensionally arranged.

16. An electric characteristics evaluation device using a scanning probe, evaluating electric characteristics of an insulating film by causing the scanning probe to scan the surface of the insulating film while supplying current between them, comprising a current detector that detects current flowing through the substrate; a sample and hold circuit that retains the current; a low pass filter that removes AC components of the current; an AC voltage supplier that applies an AC voltage between the scanning probe and the substrate; a DC voltage supplier that applies a DC voltage superimposed on the AC voltage; a trigger voltage generator that generates trigger voltages supplied to the sample and hold circuit based on the AC voltage to retain current values; and a current controller that determines the applied voltage based on the detected current.

17. The electric characteristics evaluation device using a scanning probe described in 16, in which the current is controlled by changing the amplitude of AC voltage.

18. The electric characteristics evaluation device using a scanning probe described in 16, in which, as the DC voltage, a voltage in the vicinity of a threshold voltage at which current starts flowing between the scanning probe and the substrate is applied.

19. The electric characteristics evaluation device using a scanning probe described in 16, in which an insulating film is evaluated by causing a scanning probe to scan across the surface of the insulating film while supplying current between them.

20. The electric characteristics evaluation device using a scanning probe described in 16, in which, the insulating film is evaluated by causing a scanning probe to scan the surface of the insulating film and mapping resistance values based on values of voltage and current at each scanned position.

The present invention enables faster control of current that flows through a resist layer or resistance layer without being affected by the stray capacitance between the probe and the substrate.

What is claimed is:

1. An electronic exposure device that causes a scanning probe to scan the surface of a resist layer applied on a substrate and supplies current via the scanning probe to the resist layer, thereby writing desired patterns on the resist layer, wherein current that flows through the resist layer is AC current including a charge or discharge current ascribable to a stray capacitance of the resist layer and a DC component based on a non-linearity of a current-voltage characteristic of the resist layer.

2. The electronic exposure device of claim 1, in which the current is supplied based on the sum of a DC voltage corresponding to a non-linear threshold voltage of the current-voltage characteristics of the resist layer and an AC voltage providing a current source to expose the resist layer, and the current for exposing the resist layer is controlled by changing the amplitude of the AC voltage.

3. The electronic exposure device of claim 1, wherein waveforms containing no DC components are used.

4. A method of writing patterns using a scanning probe, comprising a step of forming an electrically conductive layer on a major surface of a substrate or preparing a substrate that provides electrical conductivity by itself; a step of forming a resist layer on the electrically conductive layer; a step of controlling a voltage so that current flowing through the resist layer from a scanning probe facing the resist layer and the electrically conductive layer is an AC current including a charge or discharge current due to stray capacitance in the resist layer and a DC component based on a non-linearity of a current-voltage characteristics of the resist layer; a step of causing the scanning probe to scan on the resist layer while supplying the controlled voltage to the resist layer at positions predetermined based on pattern data to be written on the resist layer to form a latent pattern; and a step of developing the resist layer to form a desired pattern on the substrate.

5. The method of writing patterns using a scanning probe of claim 4, wherein the current is supplied based on the sum of a DC voltage corresponding to a non-linear threshold voltage of a current-voltage characteristic of the resist layer and an AC voltage provided by a current source for exposing the resist layer, the current for exposing the resist layer being controlled by changing the amplitude of the AC voltage.

6. An electronic exposure device that scans a scanning probe across the surface of a resist layer applied on a substrate and supplies current via the scanning probe to the resist layer, thereby writing desired patterns on the resist layer, comprising an AC voltage supplier that applies an AC voltage to the resist layer via the scanning probe; a DC voltage supplier that applies a DC voltage superimposed on the AC voltage; a current measuring circuit that measures current flowing through the resist layer; and a current controller that determines the applied voltage based on the measured current value.

7. The electron exposure device of claim 6, wherein a plurality of scanning probes are provided and the applied voltage is controlled for each of the plurality of the scanning probes.

8. The electron exposure device of claim 6, comprising a sample and hold circuit that retains the detected current; a low pass filter that removes AC components of the detected current; a trigger voltage generator that generates trigger voltages supplied to the sample and hold circuit based on the AC voltage to retain current values; and a current controller that determines the applied voltage based on the retained current values.

9. The electron exposure device of claim 6, wherein the applied DC voltage is determined based on the non-linearity of the current-voltage characteristic of the resist layer and the applied AC voltage is determined based on the DC component of the retained current values.

10. The electron exposure device of claim 7, comprising a sample and hold circuit that retains the detected current; a low pass filter that removes AC components of the detected current; a trigger voltage generator that generates trigger voltages supplied to the sample and hold circuit based on the AC voltage to retain current values; and a current controller that determines the applied voltage based on the retained current values.

11. The electron exposure device of claim 7, wherein the applied DC voltage is determined based on the non-linearity of the current-voltage characteristic of the resist layer and the applied AC voltage is determined based on the DC component of the retained current values.

12. An electric characteristics evaluation device having a scanning probe, causing the scanning probe to scan across the surface of an insulating layer, and evaluating the electric characteristic of the insulating layer by supplying current to the surface of the insulating layer through the scanning probe and mapping the voltage value at different positions on the surface of the insulating layer, wherein current flowing to the insulating layer through the scanning probe is an AC current including charge or discharge current based on stray capacitance of the insulating layer and a DC component based on a non-linearity of a current-voltage characteristic of the insulating layer.

* * * * *